United States Patent
Fukumasu et al.

(10) Patent No.: US 9,948,210 B2
(45) Date of Patent: Apr. 17, 2018

(54) ELECTRIC POWER CONVERSION DEVICE

(71) Applicant: Hitachi Automotive Systems, Ltd., Hitachinaka-shi, Ibaraki (JP)

(72) Inventors: Keisuke Fukumasu, Tokyo (JP); Yosei Hara, Hitachinaka (JP); Masayoshi Takahashi, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 76 days.

(21) Appl. No.: 14/771,845

(22) PCT Filed: Jan. 27, 2014

(86) PCT No.: PCT/JP2014/051712
§ 371 (c)(1),
(2) Date: Sep. 1, 2015

(87) PCT Pub. No.: WO2014/141758
PCT Pub. Date: Sep. 18, 2014

(65) Prior Publication Data
US 2016/0020707 A1   Jan. 21, 2016

(30) Foreign Application Priority Data

Mar. 11, 2013   (JP) .................... 2013-048279

(51) Int. Cl.
*H02M 7/537* (2006.01)
*H02M 7/539* (2006.01)
*H02M 7/00* (2006.01)
*H05K 7/14* (2006.01)
*H02J 7/02* (2016.01)

(52) U.S. Cl.
CPC ............ *H02M 7/539* (2013.01); *H02J 7/022* (2013.01); *H02M 7/003* (2013.01); *H05K 7/1432* (2013.01)

(58) Field of Classification Search
CPC .......... H02M 7/003; H02M 7/42; H02M 7/44; H02M 7/48; H02M 7/53; H02M 7/537;
(Continued)

(56) References Cited

U.S. PATENT DOCUMENTS 6,064,578 A  *  5/2000  Hashimoto ........... H02M 7/003
                                                         363/16
2009/0294195 A1 * 12/2009  Otsuka ................... B60K 6/405
                                                         180/65.275
(Continued)

FOREIGN PATENT DOCUMENTS

EP   0 241 250 A2   10/1987
JP   62-296770 A    12/1987
(Continued)

OTHER PUBLICATIONS

English translation of JP2012105382.*
International Search Report (PCT/ISA/210) dated Apr. 15, 2014, with English translation (Three (3) pages).

*Primary Examiner* — Timothy J Dole
*Assistant Examiner* — Carlos Rivera-Perez
(74) *Attorney, Agent, or Firm* — Crowell & Moring LLP

(57) ABSTRACT

An electric power conversion device includes a capacitor package. The capacitor package includes a first positive electrode bus bar that is connected to a positive electrode of the inverter circuit unit and connected to a smoothing capacitor. The capacitor package also includes a second positive electrode bus bar that is connected to a positive electrode on a battery side of the converter circuit unit and connected to the another smoothing capacitor. On a first side thereof the negative electrode bus bar directly overlaps the entire first positive electrode.

6 Claims, 6 Drawing Sheets

(58) Field of Classification Search
CPC .......... H02M 7/5387; H02M 7/53871; H02M 7/5388; H02M 7/539; H02M 7/5395; H02M 2001/007; H02M 2001/0067; H05K 7/1432; H05K 7/2089; H05K 7/1427; H02J 7/022
USPC ........ 323/205–211, 222–226, 266, 271–276, 323/282–288, 351; 363/15–21.03, 34, 35, 363/37, 40–47, 50, 55–56.12, 65, 95–98, 363/123–127, 131–134, 141, 144, 146, 363/147; 257/528, 532, 535; 361/18, 361/301.1, 301.2, 301.3, 309, 328–330, 361/748, 752, 753; 180/54.1, 65.1–65.31, 180/65.8

See application file for complete search history.

(56) References Cited

U.S. PATENT DOCUMENTS

2012/0044640 A1\*  2/2012  Harada .............. H05K 7/20909
                                                            361/688
2013/0200715 A1\*  8/2013  Pettersson ............. H02M 7/537
                                                            307/82

FOREIGN PATENT DOCUMENTS

| JP | 2007-174760 A | 7/2007 |
|----|---------------|--------|
| JP | 2007-318911 A | 12/2007 |
| JP | 2012-105382 A | 5/2012 |

\* cited by examiner

ELECTRIC POWER CONVERSION DEVICE

TECHNICAL FIELD

The present invention relates to an electric power conversion device that is mounted on a vehicle and converts electric power, for example, and more specifically to a mounting structure of the same.

BACKGROUND ART

Heretofore, there are already known an electric automobile that drives the vehicle with driving force from a dynamo-electric machine such as a motor, a so-called hybrid automobile including the dynamo-electric machine combined with an engine that is an internal combustion engine, and the like. These electric vehicles are generally mounted with an electric power conversion device including a DC/DC converter device that receives direct current power from a high voltage battery as a direct current power supply and converts the received direct current power into direct current power having a different voltage value, and outputs the direct current power, and an inverter device that receives the direct current power from the DC/DC converter, converts the received direct current power into alternating power, and drives a motor.

In the electric power conversion device including the DC/DC converter and the inverter, more specifically, it is possible to aim to downsize the overall electric power conversion device by accommodating the DC/DC converter and the inverter in a shared casing to form a module. For example, in Patent Literature 1 below, a structure to realize the downsizing of a device is proposed in which a smoothing capacitor for a DC/DC converter provided on the input side of the DC/DC converter and a smoothing capacitor for an inverter provided on the input side of the inverter are accommodated in a shared capacitor package.

CITATION LIST

Patent Literature

Patent Literature 1: Japanese Unexamined Patent Application Publication No. 2007-174760

SUMMARY OF INVENTION

Technical Problem

However, in the above-described electric power conversion device according to the previously existing technique, since the mounting structure is adopted in which two systems using voltage sources different from each other, that is, the smoothing capacitor for the DC/DC converter and the smoothing capacitor for the inverter are accommodated in the shared package to downsize the overall device, different positive electrode bus bars for these two systems are disposed closely to each other. Therefore, problems arise in that noise caused by the switching operation of the inverter is superposed on the input side of the DC/DC converter and noise transmitted to an external battery is increased.

When this transmission noise is carried through a cable connecting the electric power conversion device to the external battery (generally, the external battery is connected to the electric power conversion device using a shielded cable), the cable becomes an antenna to increase electromagnetic noise emitted to the inside and outside of a vehicle, and noise is caused on an on-vehicle radio. In a countermeasure, the noise can be decreased to some extent by additionally providing a filter on the external battery side of the DC/DC converter, for example. However, the effect is not always sufficient, and it is rather likely to cause an increase in manufacturing costs and an increase in the size of the device.

Therefore, the present invention is made in consideration of the above-described problems in the previously existing technique, and it is an object of the present invention to provide an electric power conversion device that can realize the downsizing of the device and at the same time can decrease noise transmitted to an external battery due to noise caused by the switching operation of an inverter more specifically.

Solution to Problem

In order to solve the problems, configurations described in claims, for example, are adopted. It is noted that the present invention includes a plurality of schemes to solve the problems. For one example, there is provided an electric power conversion device including a shared casing at a GND potential that accommodates: an inverter circuit unit that converts direct current power into alternating current power; a converter circuit unit that increases a voltage from an external battery and outputs the voltage to the inverter circuit unit or decreases a power supply voltage from the inverter circuit unit and outputs the voltage to the external battery; and a capacitor package that includes a smoothing capacitor element connected to a power supply voltage side of the inverter circuit unit and a smoothing capacitor element connected to a power supply voltage on a battery side of the converter circuit unit and integrally accommodates the elements. In the electric power conversion device, the capacitor package, together with the plurality of the smoothing capacitor elements, includes: a negative electrode bus bar connected to both of a negative electrode of the inverter circuit unit and a negative electrode side of the converter circuit unit; a first positive electrode bus bar connected to a positive electrode of the inverter circuit unit and connected to one capacitor of the smoothing capacitors; and a second positive electrode bus bar connected to a positive electrode on the battery side of the converter circuit unit and connected to the other capacitor of the smoothing capacitors. The first positive electrode bus bar is disposed at a position opposite to one principal face of the negative electrode bus bar, and the second positive electrode bus bar is disposed at a position opposite to the other principal face of the negative electrode bus bar and apart from the first positive electrode bus bar.

Advantageous Effects of Invention

According to the present invention, noise coupling between an inverter device and a DC/DC converter device can be decreased, so that it is possible to provide an electric power conversion device that can realize the downsizing of the device and at the same time can decrease noise transmitted to an external battery due to noise caused by the switching operation of an inverter more specifically.

DESCRIPTION OF EMBODIMENTS

In the following, an embodiment of the present invention will be described in detail with reference to the accompanying drawings.

Figure 1:
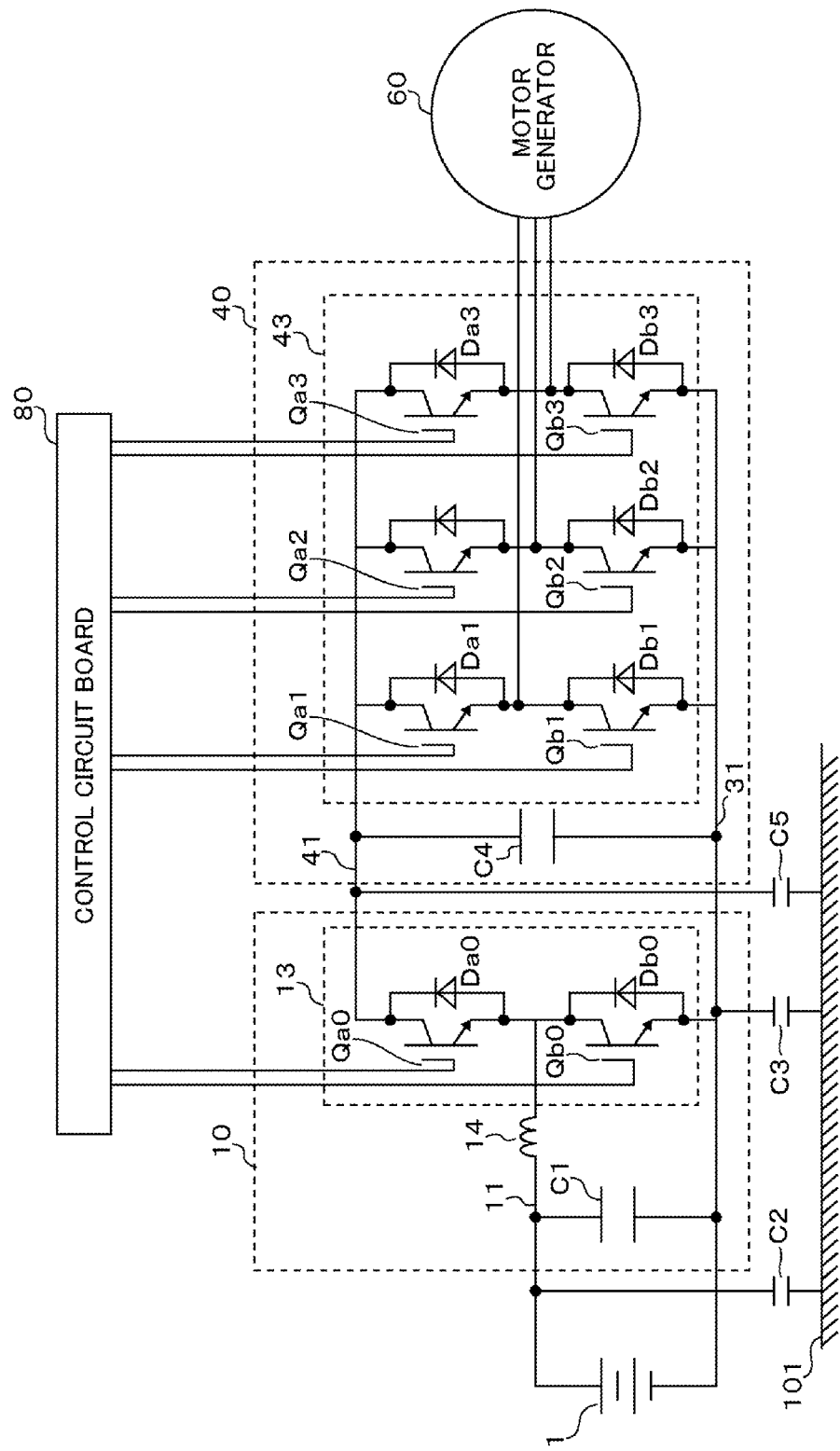
FIG. 1 is a circuit diagram of an exemplary schematic configuration of a motor drive system including an electric power conversion device according to an embodiment of the present invention.

FIG. 1 is a circuit diagram of the schematic configuration of a motor drive system including an electric power conversion device according to an embodiment of the present invention. As illustrated in the drawing, the basic configuration includes an electric power conversion device having an external battery 1 that supplies direct current power, a converter 10, and an inverter 40, a motor generator 60 that generates power by the electric power conversion device or generates electric power (in the following, simply referred to as "a motor"), and a control circuit board 80 that drives and controls the electric power conversion device. In other words, for example, this motor drive system is mounted on an electric vehicle such as a hybrid automobile and an electric automobile, and the electric power conversion device has the power running operation and regeneration operation of the motor.

In this motor drive system, in the power running operation, the converter 10 increases the direct current voltage of the external battery 1 that is a chargeable and dischargeable direct current power supply to a direct current voltage having a different value, and outputs the voltage to the inverter 40. The inverter 40 converts the direct current power into alternating current power by PWM control, and outputs the alternating current power to the motor 60. The motor 60 receives the alternating current power to rotate a rotor in the inside of the motor to be a load, and rotates the tires of the vehicle. Here, the motor 60 is a three-phase alternating current motor.

On the other hand, in the regeneration operation, the alternating current power obtained by generating electric power using the motor 60 is converted into a direct current voltage by the inverter 40, the direct current voltage is supplied to the converter 10, the value of the direct current voltage is decreased by the converter 10, and the direct current voltage is outputted to the external battery 1 for charging the external battery.

It is noted that as illustrated in FIG. 1, the above-described converter 10 and the inverter 40 are configured to include semiconductor modules 13 and 43 having switching elements such as IGBTs, and the modules switch on and off the switching elements such as IGBTs using control signals from the control circuit board 80. This control circuit board 80 controls the switching operation of the semiconductor modules based on signals from an external system, not illustrated.

Next, in the following, the detailed configuration of the converter 10 will be described, and then two operating states of the converter, which are a voltage increase operation and a voltage decrease operation, will be further described.

<Configuration and Operation of the Converter>

As apparent from FIG. 1, the converter 10 includes the semiconductor module 13, a reactor 14, and a converter smoothing capacitor C1. Moreover, the semiconductor module 13 includes a pair of switching elements Qa0 and Qb0, and diodes Da0 and Db0 are connected in parallel with each other between the collectors and emitters of the switching elements Qa0 and Qb0, respectively. The output end of the converter (the positive electrode side of the inverter 40) is connected to the collector side of the switching element Qa0, and one end of the reactor 14 and the collector side of the switching element Qb0 are connected to the emitter side. Furthermore, the other end of the reactor 14 is connected to the positive electrode side of the external battery 1, and the emitter side of the switching element Qb0 is connected to a negative electrode bus bar 31 (the negative electrode side of the external battery 1).

The converter 10 includes a voltage increase function that converts the value of a direct current voltage from the external battery 1 into the value of a direct current voltage higher than the value and outputs the direct current voltage to the inverter 40 and a voltage decrease function that converts a direct current voltage outputted from the inverter 40 to the converter 10 into a direct current voltage lower than the outputted direct current voltage and outputs the direct current voltage to the external battery 1 in the regeneration operation of the motor 60.

In the following, the voltage increase operation of the converter 10 will be described. In the converter 10, when the switching element Qb0 is turned on, a short circuit that connects the positive electrode side to the negative electrode side of the external battery 1 is formed through the external battery 1 and the reactor 14, and energy is temporarily stored on the reactor 14 with a direct electric current carried through the circuit. When the switching element Qb0 is switched from on to off in this state, the energy stored on the reactor 14 is charged on an inverter smoothing capacitor C4 through the diode Da0. In the charging, the output voltage of the converter 10 can be increased more than the input voltage of the converter 10. It is noted that in the voltage increase operation, the switching element Qa0 is always off. The description above is the description of the operation as a voltage increase converter.

Next, the voltage decrease operation of the converter 10 will be described. While the switching element Qa0 is in the on state, in the converter 10, a short circuit that connects the inverter smoothing capacitor C4 and the reactor 14 to the positive electrode side of the external battery 1 is formed, and energy stored on the inverter smoothing capacitor C4 by the regeneration operation of the motor 60 is temporarily stored on the reactor 14 while being charged on the external battery 1. When the switching element Qa0 is turned off in this state, a short circuit that connects the reactor 14 and the external battery 1 to the diode Db0 is formed, a charge current is carried from the energy temporarily stored on the reactor 14 to the external battery. Therefore, the voltage value to the external battery 1 in the regeneration operation can be controlled by the ratio of on time occupied in one cycle of on and off time of the switching element Qa0, and the converter 10 also functions as a voltage decrease converter. It is noted that in the voltage decrease operation, the switching element Qb0 is always off. Moreover, the converter smoothing capacitor C1 is connected to the external battery side of the converter 10. The converter smoothing capacitor C1 absorbs ripples produced by switching the switching elements Qa0 and Qb0. Furthermore, the converter smoothing capacitor C1 absorbs a ripple current included in a power supply current inputted from the direct current external battery 1 to the converter 10, and stabilizes the power supply current.

Next, in the following, the configuration of the inverter 40 will be described in detail.

<Configuration and Operation of the Inverter>

The inverter 40 includes the semiconductor module 43 and the inverter smoothing capacitor C4. The configuration of the semiconductor module 43 includes switching elements Qa1, Qa2, Qa3, Qb1, Qb2, and Qb3 and diodes Da1, Da2, Da3, Db1, Db2, and Db3.

The diodes are connected to the individual switching elements in parallel with each other; Qa1 is connected to Da1, Qa2 is connected to Da2, Qa3 is connected to Da3, Qb1 is connected to Db1, Qb2 is connected to Db2, and Qb3 is connected to Db3.

The inverter positive electrode bus bar 41 is connected to the collector side of the switching elements Qa1, Qa2, and Qa3. On the other hand, the negative electrode bus bar 31 is connected to the emitter side of the switching elements Qb1, Qb2, and Qb3. Moreover, the emitter side of the switching elements Qa1, Qa2, and Qa3 and the collector side of the switching elements Qb1, Qb2, and Qb3 are connected to the motor 60; Qa1 and Qb1 are connected to the U-phase, Qa2 and Qb2 are connected to the V-phase, and Qa3 and Qb3 are connected to the W-phase.

The inverter 40 can drive the motor 60 in which the switching on and off of the switching elements Qa1, Qa2, Qa3, Qb1, Qb2, and Qb3 is controlled using the output direct current power of the converter 10 and three-phase alternating current power is generated and outputted to the motor 60 that the phase of an alternating current carried through the motor is varied individually in the U-, V-, and W-phases at an angle of 120°.

Moreover, the inverter smoothing capacitor C4 is connected to the output side of the converter 10 and the input side of the inverter, and the inverter smoothing capacitor absorbs ripples produced by switching the semiconductor module 43. Furthermore, the inverter smoothing capacitor C4 smoothes the output of the voltage increase converter 10, and inputs a stabilized direct current power to the inverter 40.

<Filter>

As also illustrated in FIG. 1, the above-described converter 10 and the inverter 40 include filter capacitors C2, C3, and C5. C2 is electrically connected to the positive electrode of the converter 10, C5 is electrically connected to the positive electrode of the inverter 40 and a ground, and C3 is electrically connected to the negative electrode and the ground. The capacitors are mounted to decrease common mode noise carried through the positive electrodes and the negative electrodes, and bypass noise from the external battery 1 and noise from the converter 10 and the inverter 40 to the ground for preventing common mode noise from being transmitted to the external battery. Moreover, the capacitors also prevent common mode noise from the external battery 1 from being transmitted to the converter 10.

As also illustrated in FIG. 1 described above, in the electric power conversion device, the filter capacitors are mounted on both of the converter 10 and the inverter 40.

Since the negative electrode bus bar 31 of the inverter 40 is electrically connected to the converter 10, the filter capacitor C3 for the negative electrode is a single capacitor by sharing capacitors for the converter 10 and the inverter 40, so that downsizing can be intended by sharing components. However, in order to select the capacitance values of the filter capacitors for the individual systems, it is acceptable that the filter capacitor C3 connected to the negative electrode is not shared, and is split for the converter 10 and the inverter 40 for mounting.

Figure 2:
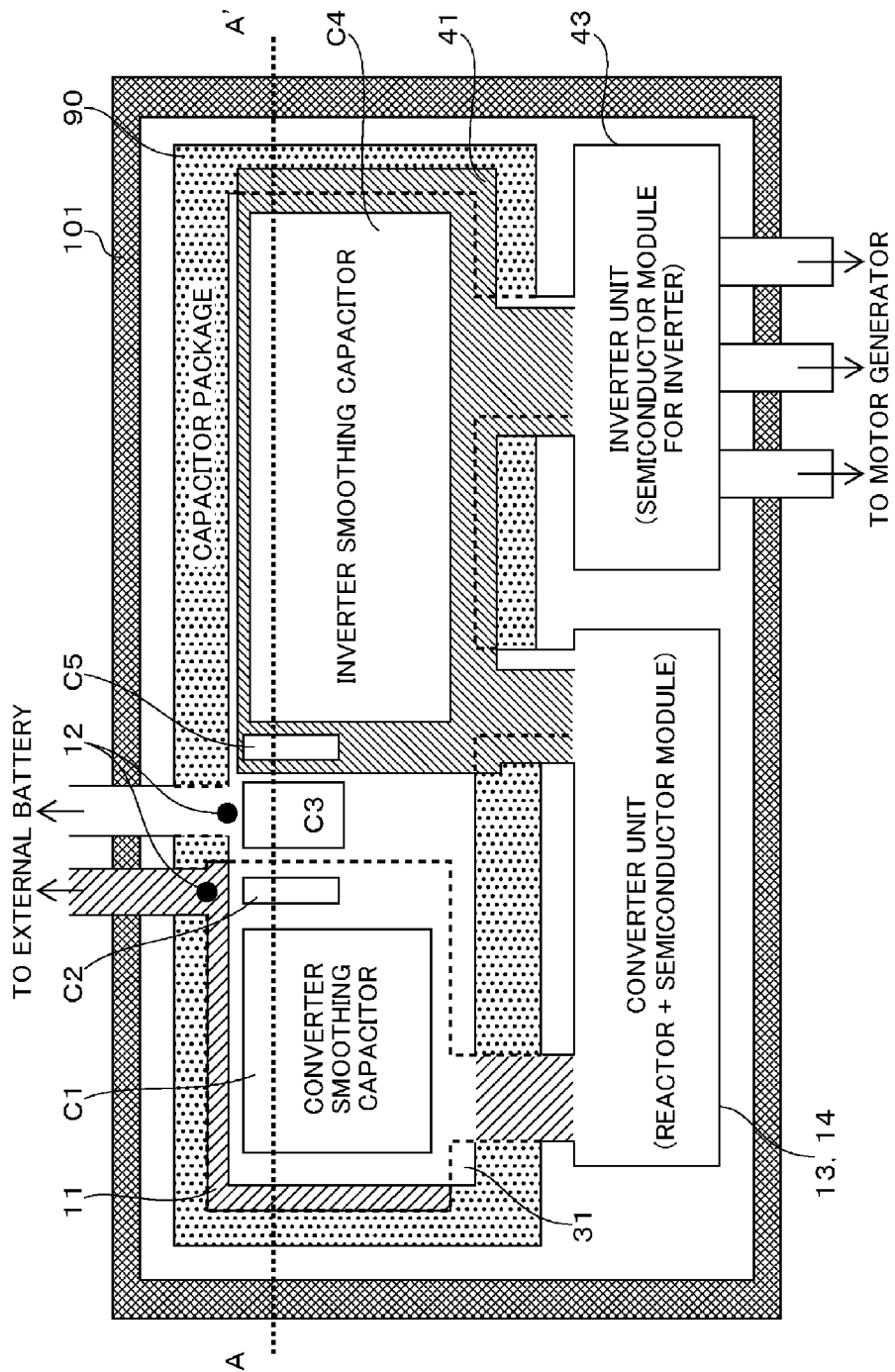
FIG. 2 is a diagram of the schematic configuration of the electric power conversion device according to the embodiment of the present invention.

The attached FIG. 2 is the mounting structure of an electric power conversion device according to an example (a first example) of the present invention. As illustrated in FIG. 2, the converter 10 (the converter smoothing capacitor C1 and the semiconductor module 13), the inverter 40 (the inverter smoothing capacitor C4 and the semiconductor module 43), and the filter capacitors C2, C3, and C5 are accommodated in a shared casing (a case at a GND potential) 101, so that the downsizing of the electric power conversion device can be intended. Here, this casing 101 is formed of a conductive material such as a metal (aluminum, for example). Thus, the casing 101 also serves as a shield function that prevents electromagnetic noise from the electronic components accommodated in the inside of the casing from being propagated to the outside and prevents external electromagnetic noise from entering the accommodation space of the electronic components. The casing 101 is electrically connected to an earth on the vehicle side (a body chassis, for example), and functions as an electrical earth for the electric power conversion device.

Moreover, although not illustrated in the drawing here, the casing (the case) 101 has a passage through which cooling water is carried, and the converter 10 and the inverter 40 accommodated in the casing 101 can be cooled with cooling water carried through the passage.

Next, in the following, the detailed structure of a capacitor package of the electric power conversion device according to the example, that is, the detail of the capacitors and the bus bars accommodated in the package will be described with reference to the attached FIGS. 3 and 4.

Capacitor Package

First Example

Figure 3:
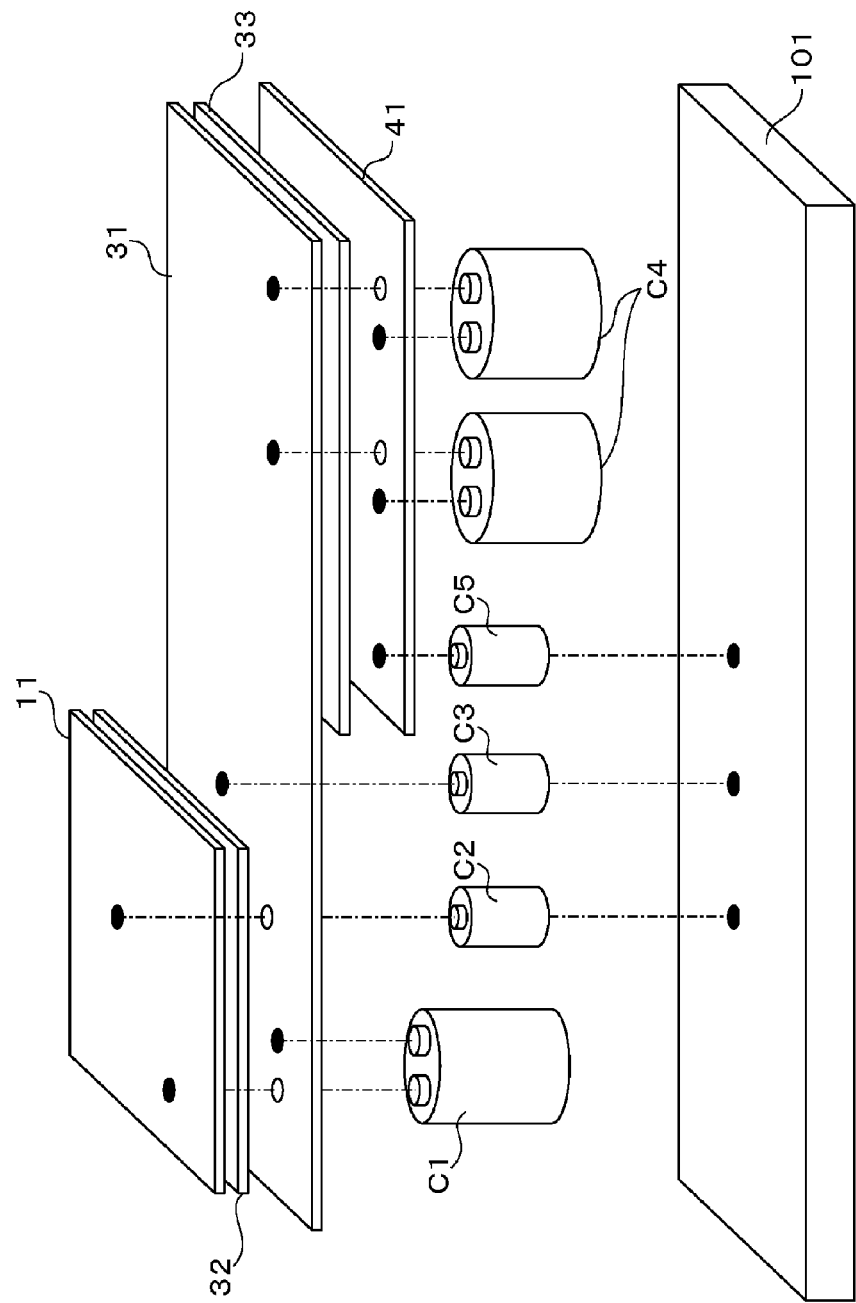
FIG. 3 is a partially exploded perspective view of the structure of bus bars in a capacitor package of the electric power conversion device.
Figure 4:
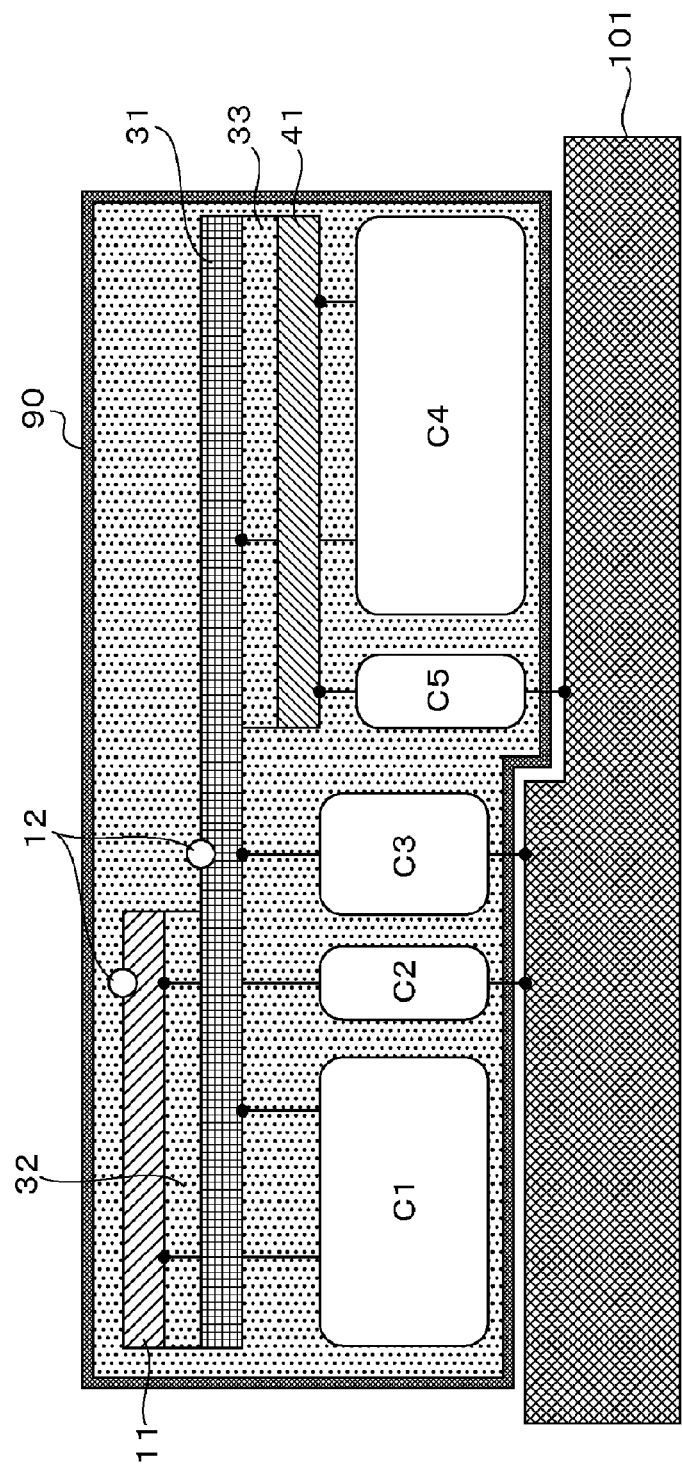
FIG. 4 is a cross sectional view (a cross section along line A-A' in FIG. 2 above) of the internal structure in the capacitor package of the electric power conversion device.

In this example, as illustrated in FIGS. 3 and 4, a plurality of film capacitors (in other words, a converter smoothing capacitor C1, an inverter smoothing capacitor C4, and filter capacitors C2, C3, and C5) and parts of conductor plates electrically connected to the film capacitors (a converter positive electrode bus bar 11, a negative electrode bus bar 31, and an inverter positive electrode bus bar 41) are accommodated in a shared capacitor package 90 (see FIG. 4) for sharing these capacitor components C1, C2, C3, C4, and C5 as one package. Thus, the downsizing of the capacitor components can be intended, and the overall electric power conversion device can be downsized. Moreover, the number of parts can be decreased, so that the workability of the assembly of the device can also be improved.

It is noted that as also apparent from FIG. 3, the converter positive electrode bus bar 11, the negative electrode bus bar 31, and the inverter positive electrode bus bar 41, which are parts of the conductor plates, are formed of members in a plate (bar) shape made of an electric conductor such as copper, for example, and plate-shaped members 32 and 33 formed of an insulating material are inserted between the converter positive electrode bus bar 11 and the negative electrode bus bar 31 and between the negative electrode bus bar 31 and the inverter positive electrode bus bar 41, respectively, for providing electrical insulation between the bus bars. Moreover, in these drawings, "●" express electrical connecting portions, and "○" express through holes, which are not electrically connected and are passed.

In other words, as illustrated in these drawings, in the capacitor package 90, the converter smoothing capacitor C1 is electrically connected to the negative electrode bus bar 31 and the converter positive electrode bus bar 11, and the inverter smoothing capacitor C4 is electrically connected to the negative electrode bus bar 31 and the inverter positive electrode bus bar 41. Furthermore, as also illustrated in FIG. 1, the negative electrode bus bar 31 of the inverter 40 is electrically connected to the converter 10, and used as a shared conductor plate.

As described above, in the electric power conversion device according to the example, since the overall device is downsized using the capacitor package 90 described above, such a structure is provided in which the positive electrode bus bars 11 and 41 of the two systems using different voltage sources are closely disposed. Therefore, capacitive or inductive noise coupling between the positive electrode bus bars 11 and 41 is increased, switching noise caused by the switching operation of the semiconductor module 43 is superposed on the input side of the converter (the converter positive electrode bus bar 11), and thus, noise transmitted to the external battery 1 is increased. Generally, the external battery 1 is connected to the converter 10 using a shielded cable or the like, for example. However, when noise transmitted to the external battery is returned to the electric power conversion device through a car body GND plane, for example, other than through the shielded cable, electromagnetic noise is emitted from this electric current loop, and noise is caused on an on-vehicle radio, for example.

In order to decrease such noise transmitted to the external battery 1 (to reduce noise), a scheme can be considered that noise coupling described above is decreased using the structure of the bus bars of the two systems, or a scheme can be considered that noise transmitted to the external battery is prevented by the positional relationship of connection between the mounted filter capacitors C2, C3, and C5 and feeding points 12 from the external battery. However, as already described, there are problems such as an increase in manufacturing costs and an increase in the size of the device.

Therefore, in the present invention, in the electric power conversion device, more specifically inside the capacitor package 90 of the device, a structure is provided to decrease a so-called noise coupling that switching noise caused by the switching operation of the semiconductor module 43 is superposed on the converter positive electrode bus bar 11 through the inverter positive electrode bus bar 41. In the following, the structure will be described in detail.

First, as illustrated in FIG. 4, the converter positive electrode bus bar 11 is disposed at a position opposite to one principal face of the negative electrode bus bar 31, and on the other hand, the inverter positive electrode bus bar 41 is disposed at a position opposite to the other principal face of the negative electrode bus bar 31. Thus, electromagnetic coupling between the converter positive electrode bus bar 11 and the inverter positive electrode bus bar 41 is interrupted using the negative electrode bus bar 31, so that noise coupling can be decreased.

Subsequently, the positional relationship of connection between the filter capacitors C2, C3, and C5 and the feeding points 12 from the external battery will be described.

As illustrated in FIG. 1, the converter 10 and the inverter 40 include the filter capacitors C2, C3, and C5. In other words, the filter capacitors C2, C3, and C5 bypass common mode noise to the ground through the filter capacitors before the common mode noise carried through the positive electrodes and the negative electrodes is transmitted to the external battery 1, and thus the filter capacitors prevent noise from being transmitted to the external battery.

Therefore, in the embodiment, it is preferable that the shared filter capacitor C3 on the negative electrode side be disposed very closely to the feeding points 12 from the external battery as illustrated in FIG. 4. With this disposition, noise produced in the semiconductor module 13 and noise produced in the semiconductor module 43 are decreased by the operation of the capacitor C3 before propagated to the external battery 1. In contrast to this, in the case where for the connection position of the negative electrode bus bar 31 to the filter capacitor C3 for the negative electrode in the capacitor package 90, the position is disposed between the feeding points 12 from the external battery and the semiconductor module 13, for example, switching noise caused by the semiconductor module 13 can be removed through the filter capacitors C2 and C3 before the switching noise is transmitted to the external battery. However, since the ESL (equivalent series inductance) of the filter capacitor C3 for the negative electrode is increased with respect to switching noise caused by switching the semiconductor module 43, the filter effect exerted by the filter capacitor C3 is decreased, and it is not possible to achieve the initial purpose of the capacitor C3.

Moreover, it is desirable to dispose the positive electrode side filter capacitor C2 for the converter closely to C3. This is because in the case where the filter capacitors C2 and C3 are disposed separately from each other, that is, for example, in the case where the filter capacitor C2 is disposed more closely to the semiconductor module 13 beyond the connecting point of C3 to the negative electrode bus bar 31, noise propagated through the negative electrode bus bar before decreased at the capacitor C3 is coupled to the positive electrode bus bar after passed through the capacitor C2 between the positive electrode bus bar and the negative electrode bus bar between the connecting points of the filter capacitors C2 and C3.

As described above in detail, the example includes the structure to decrease noise coupling that switching noise caused by the switching operation of the semiconductor module in the capacitor package is superposed on the converter positive electrode bus bar. However, the present inventors have found that noise propagation to the external battery is further decreased by decreasing various types of noise coupling including capacitive or inductive coupling (coupling) between the inverter positive electrode bus bar and the capacitor and between the converter positive electrode bus bar and the capacitor in the space of the capacitor package, that is, spatial propagation noise coupling, in addition to the structure to decrease noise coupling. In the following, the structure of a capacitor package including a structure for achieving this reduction will be described as second and third examples.

Second Example

Figure 5:
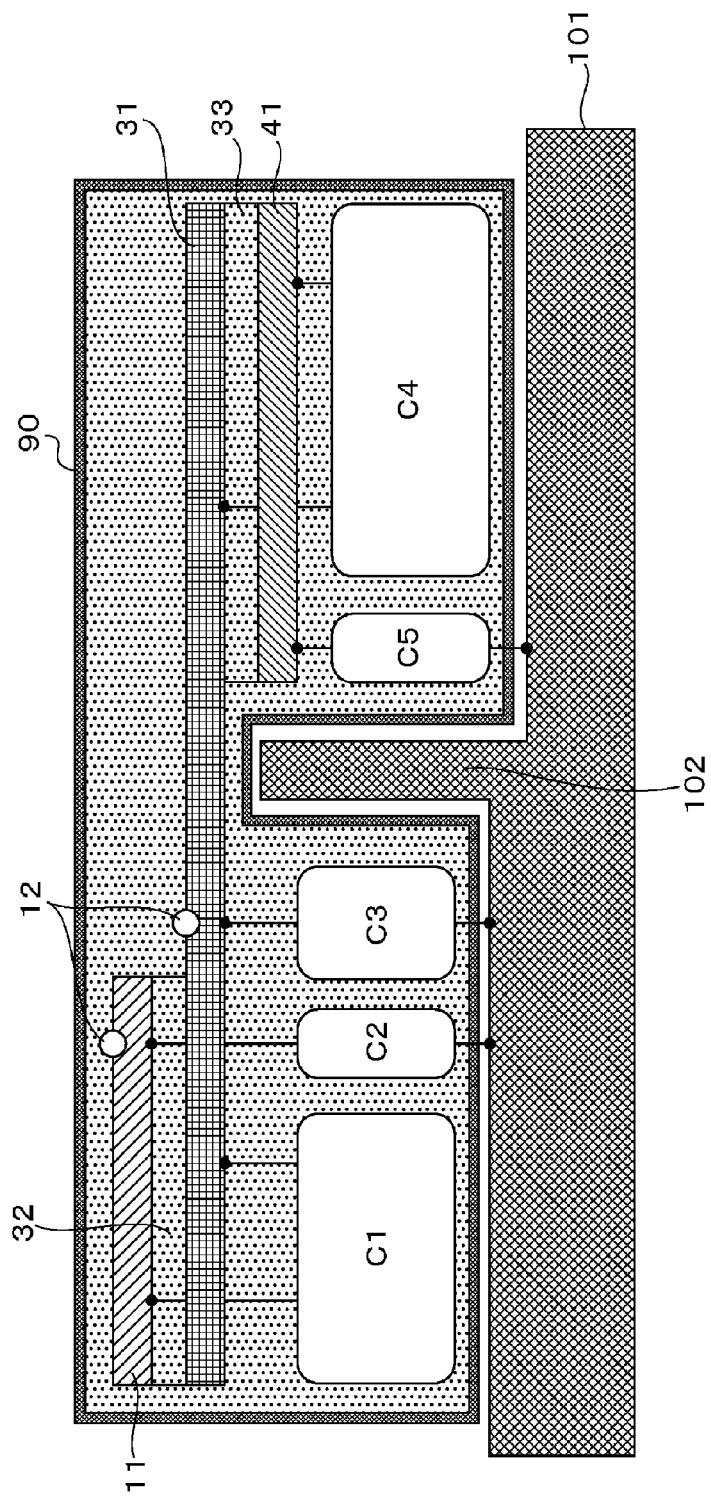
FIG. 5 is a cross sectional view (a cross section along line A-A' in FIG. 2 above) of the internal structure in a capacitor package of an electric power conversion device according to another embodiment of the present invention.

The attached FIG. 5 is a structure in a capacitor package 90 according to the second example. In this example, in addition to the first example, as also illustrated in the drawing, a slit-shaped space is provided between the capacitor C3 and the capacitor C5 in the capacitor package 90, and a shield wall 102 at the same potential as the potential (GND) of the casing 101 is inserted into the slit and disposed. With this structure, switching noise emitted from the capacitor C4 and caused by switching the inverter 40 is blocked by the shield wall 102, so that it is possible to further decrease noise coupling between the positive electrode bus bars of the converter 10 and the inverter 40.

Third Example

Figure 6:
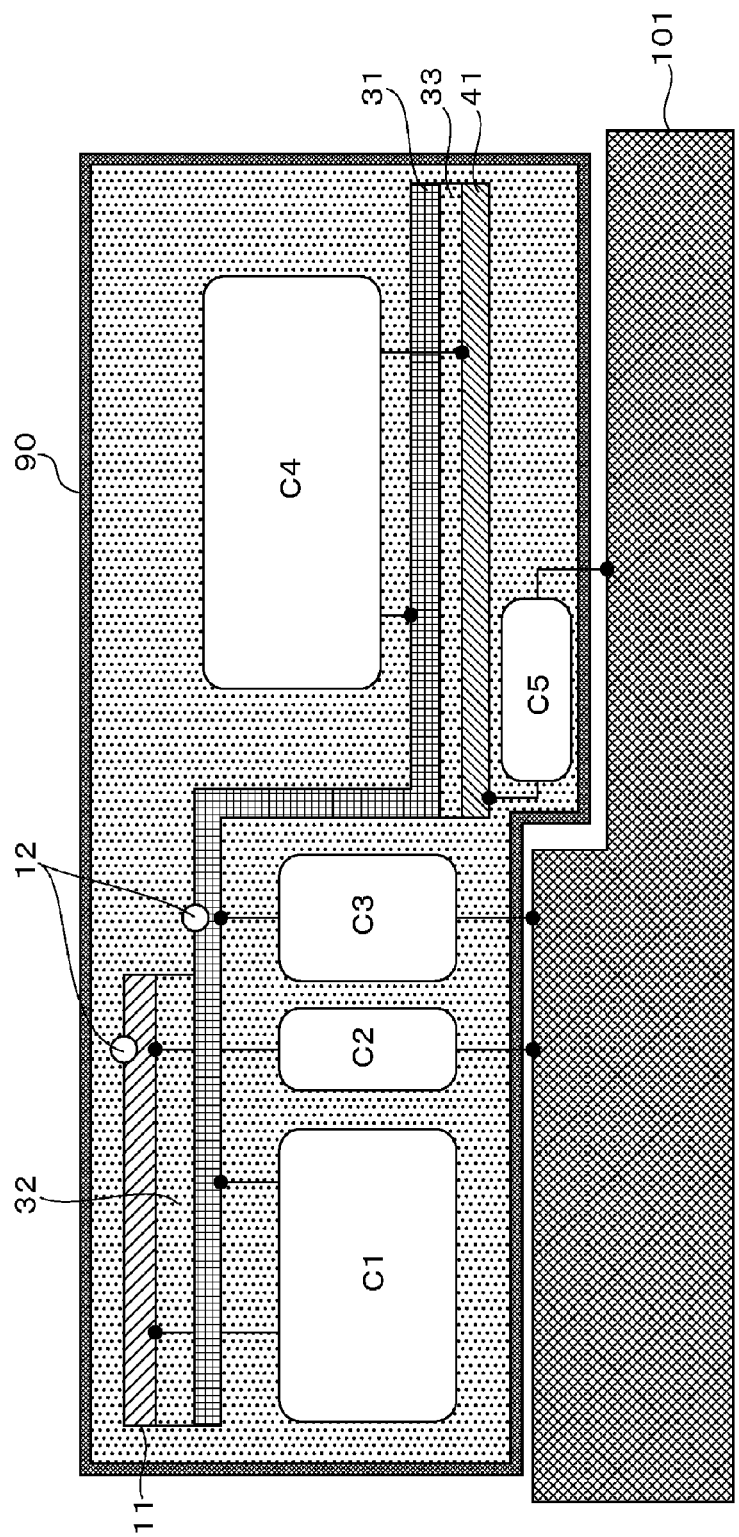
FIG. 6 is a cross sectional view (a cross section along line A-A' in FIG. 2 above) of the internal structure in a capacitor package of an electric power conversion device according to still another embodiment of the present invention.

Moreover, the attached FIG. 6 is a structure in a capacitor package 90 according to the third example. In this example, the smoothing capacitor components (C1 and C4) of the two systems are arranged and disposed in the capacitor package 90 similarly to the first example, and the negative electrode bus bar is disposed as a flat plate. However, as illustrated in FIG. 6, the components are disposed in such a manner that the negative electrode bus bar 31 is bent and the orientations of the smoothing capacitors C1 and C4 of the two systems connected to the corresponding positive electrode bus bar are directed to the opposite directions. Thus, the negative electrode bus bar 31 is disposed between these two smoothing capacitor cells, so that switching noise emitted from the inverter smoothing capacitor C4 and caused by switching the inverter 40 can be interrupted at the negative electrode bus bar 31. Moreover, the distance between the positive electrode bus bars 11 and 41 of the two systems can be increased by the height of the capacitor cells, so that it is possible to decrease noise coupled from the inverter 40 to the converter 10, and it is possible to decrease noise transmitted to the external battery 1.

In the examples of the present invention, the description is made for an example of a vehicle system that drives a single motor as an example of the motor drive system including the electric power conversion device having the converter and the inverter mounted on the inside of the same casing. However, the present invention is not limited to the examples. In addition, the present invention can also be adapted to different system forms such as a system in which a plurality of inverters are connected in parallel with each other on the output side of the converter 40 to drive a plurality of motors, for example. Also in this case, the similar effects can be obtained.

Moreover, it is acceptable that the foregoing embodiments are used independently or in combinations. This is because the effects of the embodiments can be exerted independently or in multiplication. Furthermore, the present invention is not limited to the above-described embodiments at all as long as the features are not impaired.

LIST OF REFERENCE SIGNS

1 . . . External battery
10 . . . Converter
11 . . . Converter positive electrode bus bar
12 . . . Feeding point from external battery
13 . . . Converter semiconductor module
14 . . . Reactor
31 . . . Shared negative electrode bus bar
40 . . . Inverter
41 . . . Inverter positive electrode bus bar
43 . . . Inverter semiconductor module
60 . . . Motor generator
80 . . . Control circuit board
90 . . . Capacitor package
101 . . . Case (GND potential case)
102 . . . Shield wall
C1 . . . Converter smoothing capacitor
C2 . . . Converter positive filter capacitor
C3 . . . Negative electrode side filter capacitor
C4 . . . Inverter smoothing capacitor
C5 . . . Inverter positive filter capacitor
Qa0, Qa1, Qa2, Qa3, Qb0, Qb1, Qb2, and Qb3 . . . Switching element
Da0, Da1, Da2, Da3, Db0, Db1, Db2, and Db3 . . . Diode

The invention claimed is:

1. An electric power conversion device comprising: a shared casing at a GND potential that accommodates:
   an inverter circuit unit that converts direct current power into alternating current power;
   a converter circuit unit that increases a voltage from an external battery and outputs the voltage to the inverter circuit unit or decreases a power supply voltage from the inverter circuit unit and outputs the voltage to the external battery; and
   a capacitor package that includes a smoothing capacitor element connected to a power supply voltage side of the inverter circuit unit and a smoothing capacitor element connected to a power supply voltage on a battery side of the converter circuit unit and integrally accommodates the elements,
   wherein the capacitor package, together with the plurality of the smoothing capacitor elements, includes:
   a negative electrode bus bar connected to both of a negative electrode of the inverter circuit unit and a negative electrode side of the converter circuit unit;
   a first positive electrode bus bar connected to a positive electrode of the inverter circuit unit and connected to one capacitor of the smoothing capacitors; and
   a second positive electrode bus bar connected to a positive electrode on the battery side of the converter circuit unit and connected to the other capacitor of the smoothing capacitors;
   the first positive electrode bus bar is disposed at a position opposite to one principal face of the negative electrode bus bar; and
   the second positive electrode bus bar is disposed at a position opposite to the other principal face of the negative electrode bus bar and a part projected from a stacking direction is arranged at a position not overlapping with the first positive electrode bus bar.

2. The electric power conversion device according to claim 1,
   wherein the first positive electrode bus bar and the smoothing capacitor connected to the inverter circuit unit as well as the second positive electrode bus bar and the smoothing capacitor connected to the converter circuit unit are disposed in the capacitor package in a manner that spatial propagation noise coupling is low.

3. The electric power conversion device according to claim 2,
   wherein a slit portion is provided between the smoothing capacitor connected to the inverter circuit unit and the smoothing capacitor connected to the converter circuit unit on a part of the capacitor package; and
   a shield wall formed on a part of the shared casing at the GND potential is inserted into and disposed on the slit portion.

4. The electric power conversion device according to claim 2,
   wherein the negative electrode bus bar is disposed to partition a space in the capacitor package into a plurality of spaces; and the smoothing capacitor connected to the inverter circuit unit is disposed on one space and the smoothing capacitor connected to the converter circuit unit is disposed on the other space.

5. The electric power conversion device according to claim 1, further comprising:
a first filter capacitor electrically connected between the first positive electrode bus bar and the shared casing at the GND potential; and
a second filter capacitor electrically connected between the negative electrode bus bar and the shared casing at the GND potential,
wherein the second filter capacitor is connected closely to a feeding point from the external battery on the negative electrode bus bar in the capacitor package.

6. The electric power conversion device according to claim 5, further comprising a third filter capacitor electrically connected between the second positive electrode bus bar and the shared casing at the GND potential,
wherein the third filter capacitor is connected closely to a feeding point from the external battery on the second positive electrode bus bar in the capacitor package.

* * * * *